(12) United States Patent
Jung et al.

(10) Patent No.: US 9,899,116 B2
(45) Date of Patent: Feb. 20, 2018

(54) SILVER NANOWIRE CONDUCTIVE FILM AND METHOD OF FABRICATING THE SAME

(71) Applicant: RESEARCH & BUSINESS FOUNDATION SUNGKYUNKWAN UNIVERSITY, Suwon-si (KR)

(72) Inventors: Hyun Suk Jung, Seoul (KR); Dong Jun Lee, Namyangju-si (KR); Yun Jin An, Jeju-si (KR); Gi Ra Yi, Suwon-si (KR)

(73) Assignee: Research & Business Foundation Sungkyunkwan University, Suwon-si (KR)

( * ) Notice: Subject to any disclaimer, the term of this patent is extended or adjusted under 35 U.S.C. 154(b) by 903 days.

(21) Appl. No.: 13/943,940

(22) Filed: Jul. 17, 2013

(65) Prior Publication Data

US 2014/0020737 A1    Jan. 23, 2014

(30) Foreign Application Priority Data

Jul. 18, 2012    (KR) .......................... 10-2012-0078291

(51) Int. Cl.
*H01L 31/0224* (2006.01)
*H01B 1/02* (2006.01)
*H01B 13/30* (2006.01)
*H01L 31/18* (2006.01)
*G02F 1/1343* (2006.01)

(52) U.S. Cl.
CPC .............. *H01B 1/02* (2013.01); *H01B 13/30* (2013.01); *H01L 31/022466* (2013.01); *H01L 31/022491* (2013.01); *H01L 31/1884* (2013.01); *G02F 1/13439* (2013.01); *Y02E 10/50* (2013.01); *Y10T 428/249948* (2015.04)

(58) Field of Classification Search
CPC ... H01B 1/02; H01B 13/30; H01L 31/022491; H01L 31/022466; H01L 31/1884; Y10T 428/249948; G02F 1/13439; Y02E 10/50
See application file for complete search history.

(56) References Cited

U.S. PATENT DOCUMENTS

| 6,936,761 | B2 * | 8/2005 | Pichler | .................... | G02F 1/155 136/252 |
| 7,511,217 | B1 * | 3/2009 | Roscheisen | ............ | B82Y 10/00 136/256 |
| 8,018,568 | B2 * | 9/2011 | Allemand | .............. | B82Y 10/00 349/187 |

(Continued)

OTHER PUBLICATIONS

Du, Jimin, et al. "Controlled synthesis of Ag/TiO2 core-shell nanowires with smooth and bristled surfaces via a one-step solution route." Langmuir 22.3 (2006): 1307-1312. (In English).

(Continued)

*Primary Examiner* — Golam Mowla
(74) *Attorney, Agent, or Firm* — NSIP Law (57) ABSTRACT

Provided are a silver nanowire conductive film coated with an oxidation protection layer and a method for fabricating the same. A silver nanowire conductive film coated with an oxidation protection layer includes: a substrate; silver nanowires disposed on the substrate; and an oxidation protection layer coated on the silver nanowires, wherein the oxidation protection layer comprises an oxide.

10 Claims, 10 Drawing Sheets

(56) References Cited

U.S. PATENT DOCUMENTS

| | | | | |
|---|---|---|---|---|
| 8,957,322 B2* | 2/2015 | Wolk | ............... | H05K 1/0296 |
| | | | | 174/257 |
| 8,969,731 B2* | 3/2015 | Srinivas | ............... | G06F 3/041 |
| | | | | 174/250 |
| 8,974,900 B2* | 3/2015 | Eckert | ............... | H01L 31/1884 |
| | | | | 428/292.1 |
| 2007/0074316 A1* | 3/2007 | Alden | ............... | B82Y 30/00 |
| | | | | 257/784 |
| 2008/0143906 A1* | 6/2008 | Allemand | ............... | B82Y 10/00 |
| | | | | 349/43 |
| 2010/0243295 A1* | 9/2010 | Allemand | ............... | B82Y 10/00 |
| | | | | 174/250 |
| 2010/0255323 A1* | 10/2010 | Nakamura | ............... | H01B 1/22 |
| | | | | 428/457 |

OTHER PUBLICATIONS

Standridge, Stacey D., et al. "Toward plasmonic solar cells: protection of silver nanoparticles via atomic layer deposition of TiO2." Langmuir 25.5 (2009): 2596-2600. (In English).

* cited by examiner

CORROISION OF Ag NANORWIRE

[Fig 9]

TiO₂ OXIDATION PROTECTION LAYER COATING

SILVER NANOWIRE CONDUCTIVE FILM AND METHOD OF FABRICATING THE SAME

CROSS-REFERENCE TO RELATED APPLICATION

This application claims the benefit under 35 U.S.C. § 119(a) of Korean Patent Application No. 2012-0078291, filed on Jul. 18, 2012, in the Korean Intellectual Property Office, the entire disclosure of which is incorporated herein by reference for all purposes.

BACKGROUND

1. Field

The following description relates to a method for preventing oxidation of a silver nanowire conductive film and to a silver nanowire conductive film coated with an oxidation protection layer.

The present application is based on the result of global frontier business/veteran researcher supporting business (Project name: Superhigh Speed Charge Collection Nanomaterial Design and Synthesis Technology Development: 2011-0031606/Three-dimensional Nanostructure Flexible Optical Electrode Development for Organic-Inorganic Hybrid Flexible Thin Film Solar Cell Implementation: 2011-0017210)(Managing department name: National Research Foundation of Korea (NRF))(Ministry name: Ministry of Education and Science Technology (MEST)) and the result of knowledge economy technological innovation business (new renewable energy technology development business) (Project name: Non-electrolyte Super Optical Wavelength Absorption Thin Film Solar Cell Development: 2010-T100100460)(Ministry name: Ministry of Knowledge Economy)(Research management professional organization: Korea Institute of Energy Technology Evaluation and Planning (KETEP)).

2. Discussion of Related Art

A considerable amount of research has been conducted in the recent years to develop flexible and transparent conductive films. In particular, research on transparent conductive films that include silver as the conductive element has been quite active. Silver has the highest conductivity among elements of the periodic table in form of nanoparticles. However, the conductivity of silver nanoparticles decreases over time due to oxidation.

Figure 1:
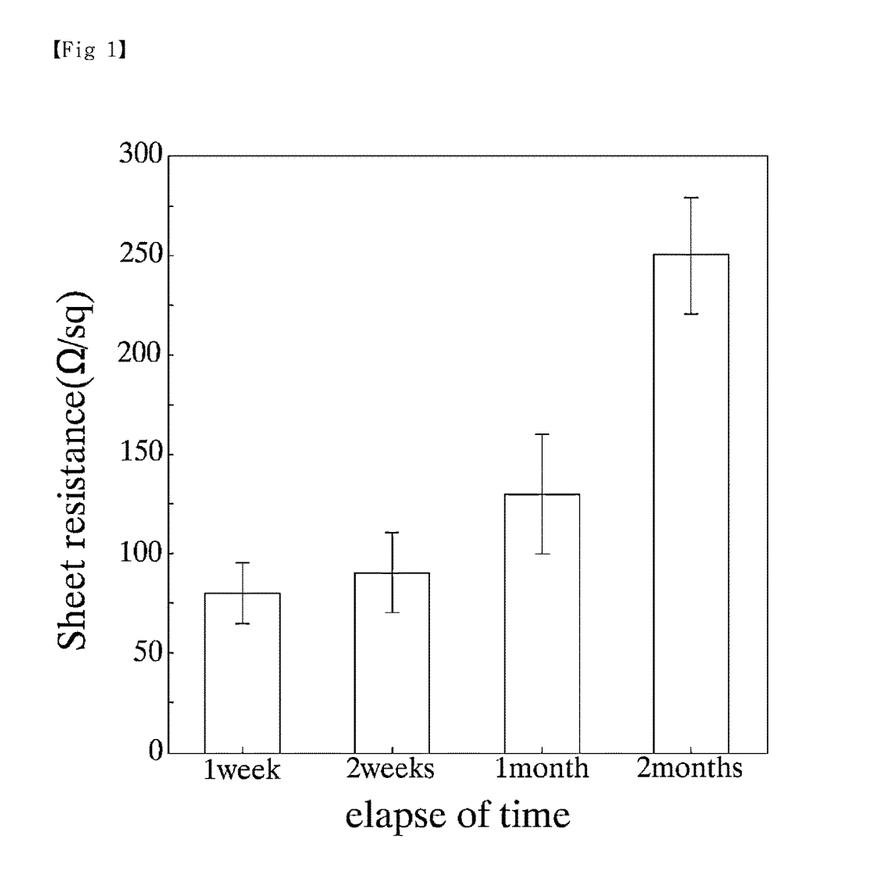
FIG. 1 is a graph showing sheet resistance versus time of a silver nanowire conductive film not coated with an oxidation protection layer.

As shown in FIG. 1, sheet resistance of a silver nanowire increases rapidly as time elapses. The conductivity of a silver nanowire is lowered due to the increase in sheet resistance.

Silver in a bulk state has excellent corrosion resistance and thus is not well oxidized. However, in case of nanoparticle-sized silver, due to a substantial increase in surface area, the reactivity of the nanoparticle-sized silver increases and the nanoparticle-sized silver particles are thus oxidized, causing the conductivity of silver to decrease. Thus, when a flexible transparent conductive film is fabricated using silver nanowires, the performance of the silver nanowire conductive film may deteriorate over time due to oxidation. However, existing researches focus on a method of fabricating a flexible transparent conductive film using silver nanowires without addressing the performance degradation caused by oxidation of the silver nanowires.

In actuality, performance characteristics, such as flexibility, light transmittance, and conductivity, are important to fabricate and commercialize the use of a flexible transparent conductive film that includes silver nanowires. Further, in the event that the flexible transparent conductive film is not used in fabricating a display device as a replacement for ITO, in many applications, the reliability of conductivity of the film is more important than the transmittance or transparency to utilize nanoparticles of silver. Thus, it is desirable to determine a method of reliably maintaining the conductivity of the silver nanoparticles for a long time.

SUMMARY

In one general aspect, there is provided a silver nanowire conductive film, including: a substrate; silver nanowires disposed on the substrate; and an oxidation protection layer coated on the silver nanowires, in which the oxidation protection layer includes an oxide.

The substrate may include a flexible polymer film, and the silver nanowires may be disposed on the polymer film by spreading a silver nanowire resin in which the silver nanowires are dispersed with a doctor blade.

The oxide may be a metal oxide or a metalloid oxide including at least one selected from the group consisting of Ti, V, Ni, Cu, Zn, Zr, Nb, Y, Al, Si, Sn, and In.

The oxidation protection layer may be coated by an atomic layer deposition (ALD) process.

A thickness of the oxidation protection layer may be 20 nm or less.

A thickness of the oxidation protection layer may be 18 nm or greater and 23 nm or less.

The sheet resistance of the silver nanowire conductive film may remain under 100 Ω/sq after 60-day exposure to atmosphere under a standard temperature and pressure condition.

The silver nanowire conductive film may be a flexible transparent conductive film having a light transmittance of 70% or greater between 400-800 nm.

In another general aspect, there is provided a method of fabricating a silver nanowire conductive film, involving: applying silver nanowires on a substrate; and coating an oxidation protection layer on a surface of the silver nanowires, in which the oxidation protection layer comprises an oxide.

The substrate may include a flexible polymer film, and the silver nanowires may be applied on the polymer film by spreading a silver nanowire resin in which the siliver nanowires are dispersed with a doctor blade.

The oxide may be a metal oxide or a metalloid oxide including at least one selected from the group consisting of Ti, V, Ni, Cu, Zn, Zr, Nb, Y, Al, Si, Sn, and In.

The applying of an oxidation protection layer on a surface of the silver nanowires may be performed by an atomic layer deposition (ALD) process.

A thickness of the oxidation protection layer may be 20 nm or less.

A thickness of the oxidation protection layer may be 18 nm or greater and 23 nm or less.

In another general aspect, there is provided a solar cell including an electrode comprising the silver nanowire conductive film described above.

In yet another general aspect, there is provided a display device including an electrode comprising the silver nanowire conductive film described above.

The display device may be an LCD screen, and the electrode may have a light transmittance of 70% or greater between 400-800 nm.

A thickness of the oxidation protection layer may be 20 nm.

Other features and aspects may be apparent from the following detailed description, the drawings, and the claims.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. Accordingly, various changes, modifications, and equivalents of the systems, apparatuses and/or methods described herein will be suggested to those of ordinary skill in the art. Also, descriptions of well-known functions and constructions may be omitted for increased clarity and conciseness.

As mentioned above, the conductivity of silver nanoparticles may decrease over time due to oxidation. This results in an increase in sheet resistance over time, as illustrated in FIG. 1.

As illustrated in FIG. 1, the sheet resistance of a silver nanowire conductive film increases over time. The inventor of the present disclosure analyzed a silver nanowire transparent conductive film after it was fabricated to check the reason for the increase in sheet resistance, and the analysis results are shown in FIG. 2.

Figure 2A:
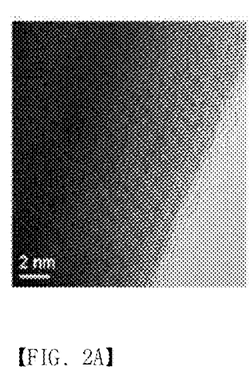
FIGS. 2(a)-(c) are transmission electron microscope (TEM) images and an energy dispersive spectrometer (EDS) photo of a silver nanowire transparent conductive film not coated with an oxidation protection layer.
Figure 2B:
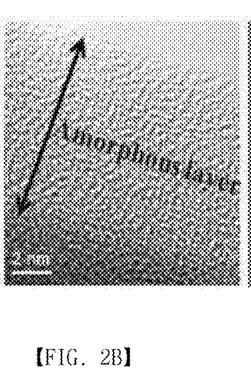
Figure 2C:
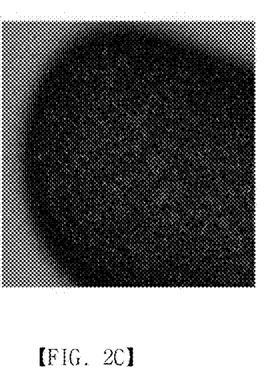

FIG. 2(a) is a transmission electron microscope (TEM) image produced immediately after the fabrication of a silver nanowire transparent conductive film that was not coated with an oxidation protection layer. FIG. 2(b) is a TEM image taken two months after the film was fabricated. FIG. 2(b) shows that an amorphous layer formed on the surface of the silver nanowire transparent conductive film. The photo illustrated in FIG. 2(c) is an energy dispersive spectrometer (EDS) photo taken two months after the film was fabricated, and the red dots represent oxygen. It has been concluded that, over time since the fabrication of the film, the silver nanowires that were exposed to atmosphere reacted with $H_2O$ and $CO_2$, resulting in the formation of an oxide layer on the surface of the silver nanowires.

Figure 3A:
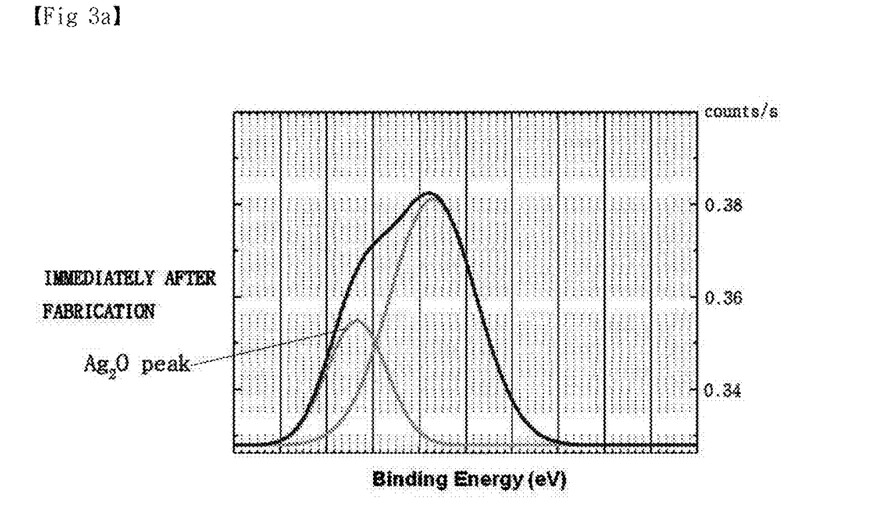
FIGS. 3(a) and 3(b) illustrate X-ray photoelectron spectroscopy (XPS) data of a silver nanowire transparent conductive film not coated with an oxidation protection layer.
Figure 3B:
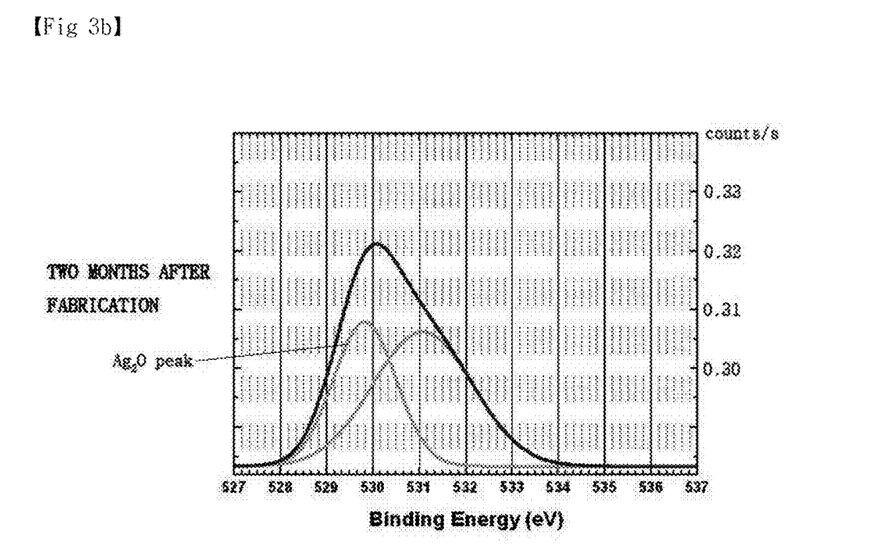

FIGS. 3(a) and 3(b) include a graph showing X-ray photoelectron spectroscopy (XPS) data acquired immediately after a silver nanowire transparent conductive film that was not coated with an oxidation protection layer was fabricated, and a graph showing XPS data acquired two months after the silver nanowire transparent conductive film was fabricated. Comparing the two sets of XPS data, two months after fabrication of the film, a silver oxide ($Ag_2O$) peak is quite pronounced. It was ascertained from this peak that an amorphous oxide layer in the form of $Ag_2O$ had formed on the surface of the silver nanowire.

Due to the oxide layer, the sheet resistance of the silver nanowire transparent conductive film increased drastically (see FIG. 1), and the conductivity of the silver nanowire transparent conductive film decreased. In order to improve the performance characteristics, the inventors of the present disclosure have proposed various examples described below.

In one example, the inventors of the present disclosure propose fabricating a flexible transparent conductive film capable of preventing an increase in sheet resistance by coating a thin oxidation protection layer on the surface of silver nanoparticles. Such a flexible transparent conductive film may be used in a various application. For example, the flexible transparent conductive film may be used as an electrode for a flexible solar cell, and may replace an indium tin oxide (ITO) or fluorine-doped tin oxide (FTO) electrode that are often used in such a solar cell.

According to one example, the silver nanowire conductive film coated with an oxidation protection layer may include a polymer film onto which silver nanowires are applied, and an oxidation protection layer coated on the surface of the silver nanowires.

The polymer film may be a film having flexibility and transparency, such as a polyester (PET) film. The silver nanowires may be applied onto the polymer film by various methods, including a doctor blade technique.

Figure 4:
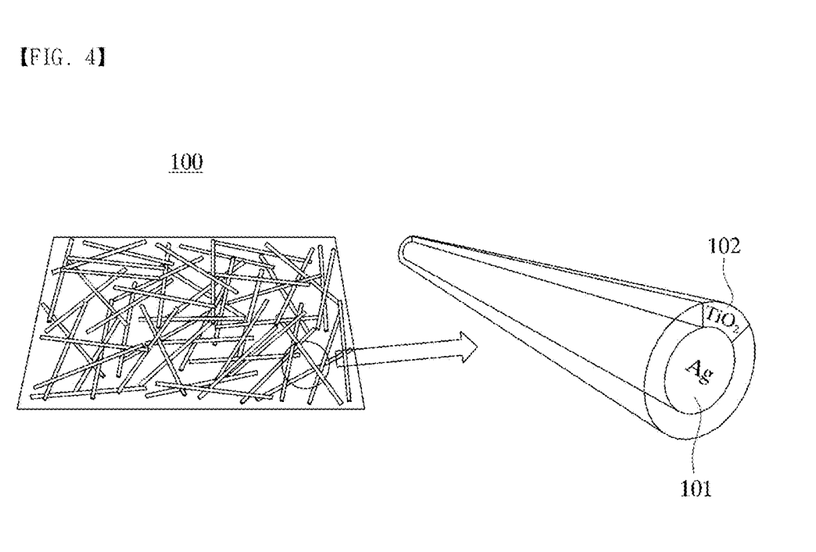
FIG. 4 is a schematic diagram of an example of a silver nanowire transparent conductive film coated with an oxidation protection layer.
Figure 5:
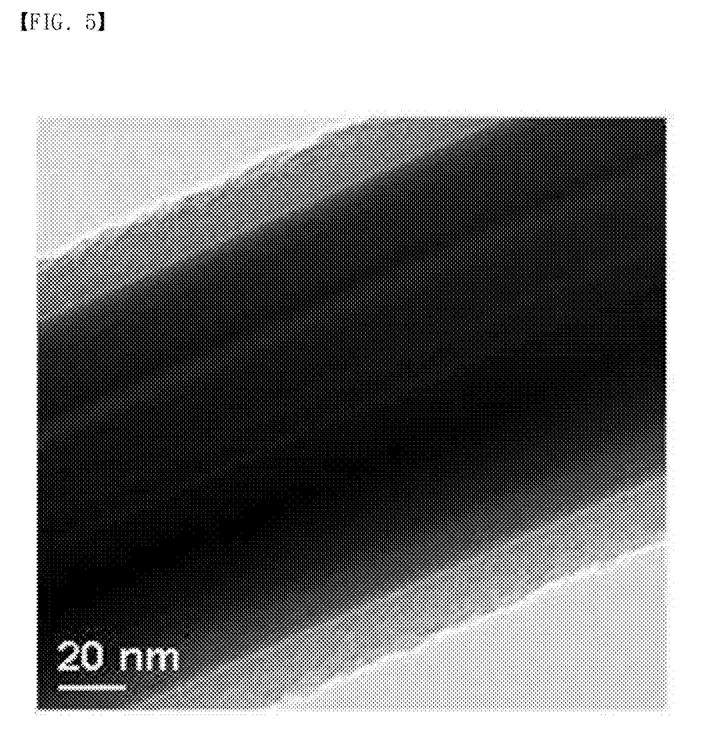
FIG. 5 is a TEM image of an example of a silver nanowire coated with an oxidation protection layer.

Referring to FIG. 4, in one example of a silver nanowire conductive film 100, the oxidation protection layer 102 is coated on the surface of silver nanowires 101 of the siliver nanowire conductive film 100. As shown in FIG. 4, the periphery of the silver nanowire 101 may be surrounded by an oxide, such as $TiO_2$. FIG. 5 is a TEM image of a silver nanowire 101 that is surrounded by a $TiO_2$ oxide layer. In FIG. 5, a black portion represents a silver nanowire, and a gray portion around the black portion represents a coated oxide.

In a silver nanowire conductive film having the illustrated structure, the oxidation protection layer is formed of an oxide that does not react with $H_2O$ and $CO_2$. The oxide may contain at least one selected from the group consisting of Ti, V, Ni, Cu, Zn, Zr, Nb, Y, Al, Si, Sn, and In.

Figure 11:
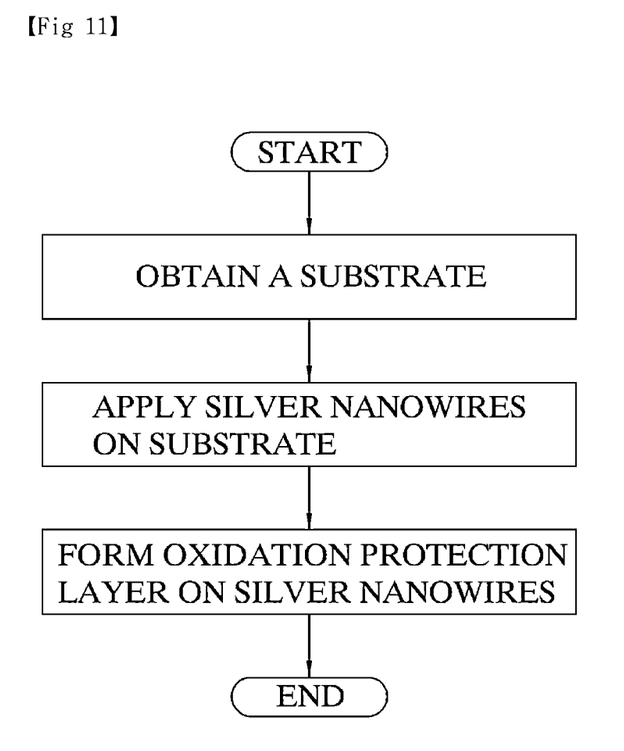
FIG. 11 is a flow chart illustrating an example of a method of fabricating a silver nanowire conductive film with an oxidation protection layer.

Referring to FIG. 11, a method of fabricating a silver nanowire conductive film coated with an oxidation protection layer, according to an example of the present disclosure, includes obtaining a substrate such as a polymer film as in 201, applying silver nanowires onto a polymer film as in 202; and coating an oxidation protection layer on the surface of the silver nanowires as in 203.

The polymer film may be a film having flexibility and transparency, such as a PET film. The silver nanowires are applied to a surface of the polymer film. While a polymer film is used in this example, a different flexible material may be used as the substrate.

In this example, the silver nanowires may have a thickness of approximately 40 nm to 200 nm, or 100 nm to 150 nm The silver nanowires may be applied on the polymer film by forming a resin paste of the silver nanowires, and applying the resin paste on the polymer film as to form a silver nanowire layer of a thickness of 300-1000 nm, 400-800 nm, or 500-700 nm, for example, by a doctor blade technique. However, various different methods may be used to apply the silver nanowires onto the polymer film.

Next, the oxidation protection layer is coated on the surface of the silver nanowires. A material for the oxidation protection layer has been already mentioned as above, and a method of coating the oxidation protection layer may be atomic layer deposition (ALD).

Methods other than ALD may also be used. However, the thickness of the oxidation protection layer can be precisely adjusted using ALD. As will be described below, the thickness of the oxidation protection layer also affects light transmittance and sheet resistance. Thus, the thickness of the oxidation protection layer needs to be precisely adjusted, and ALD may be used for this purpose.

The oxidation protection layer is coated on the surface of the silver nanowire so as to prevent the oxidation of the silver nanowire transparent conductive film. In this example, if light transmittance is lowered or sheet resistance increases due to the oxidation protection layer coating, this adversely affects characteristics of an electrode. Thus, the thickness of the coated oxidation protection layer should be adjusted to maintain low sheet resistance and desired light transmittance. According to one example, the oxidation protection layer may be formed of a TiO2 layer and may have a thickness of approximately 10 nm to 25 nm, 15 nm to 23 nm, 18 nm to 21 nm, or approximately 20 nm.

Various methods may be used to form the oxidation protection layer on the silver nanowires. Further, in another example, the oxidation protection layer can be first formed on the silver nanowires, and the coated silver nanowires can be applied to the polymer film to form a silver nanowire layer above the polymer film.

Figure 6:
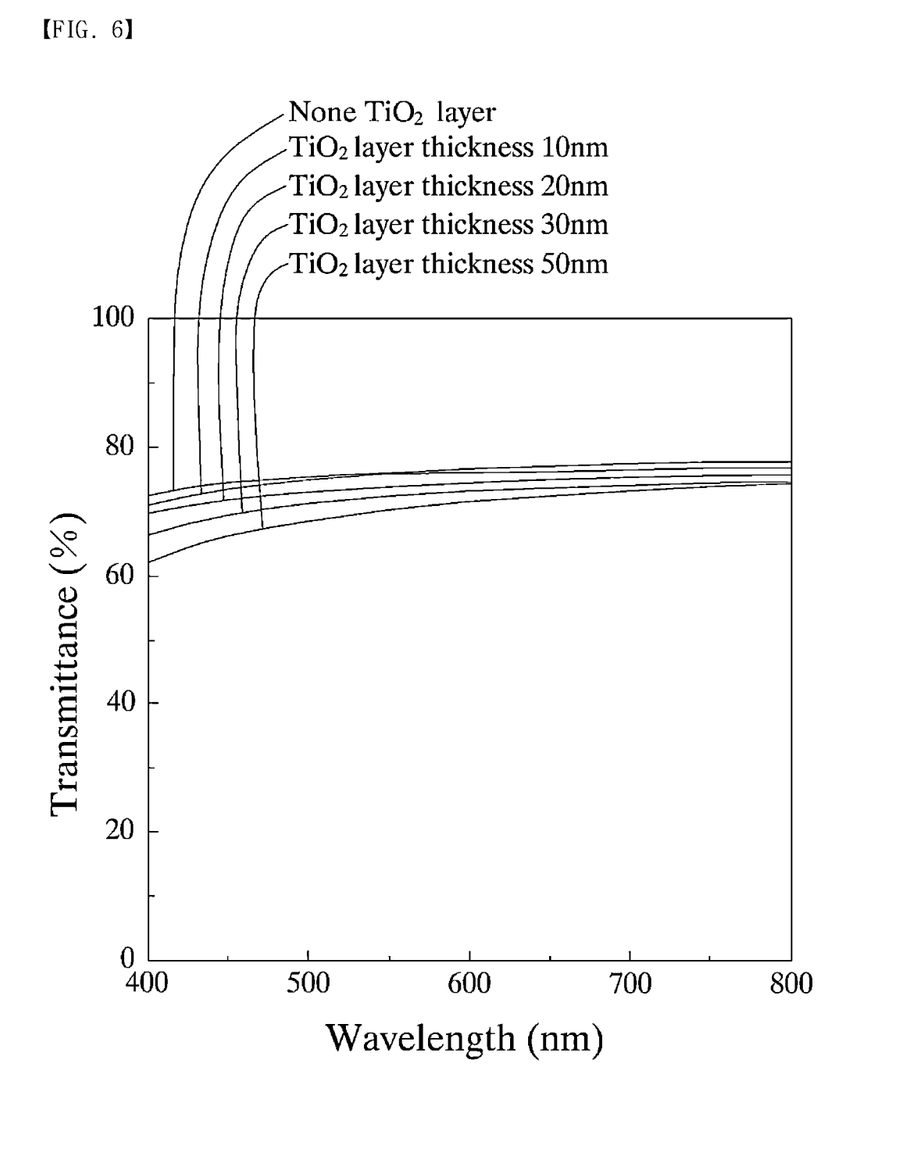
FIG. 6 is a graph showing a change in light transmittance of examples of silver nanowire transparent conductive films at different wavelengths versus various thicknesses of oxidation protection layers.

FIG. 6 is a graph showing changes in light transmittance of a silver nanowire transparent conductive film at different wavelengths versus various thicknesses of oxidation protection layers. As shown in FIG. 6, for light having a short wavelength, as the thickness of the oxidation protection layer increases, the light transmittance decreases drastically.

Figure 7:
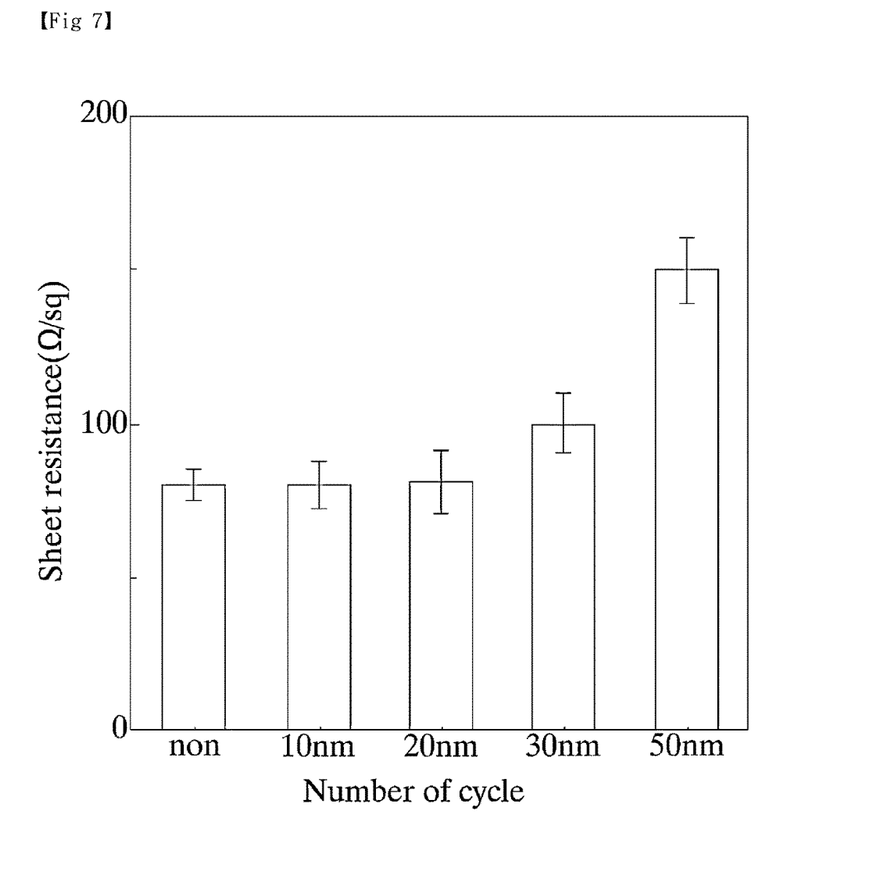
FIG. 7 is a graph showing changes in sheet resistance of various examples of silver nanowire transparent conductive films versus thicknesses of oxidation protection layers.

FIG. 7 is a graph showing changes in sheet resistance of a silver nanowire transparent conductive film versus various thicknesses of oxidation protection layers. As shown in FIG. 7, the sheet resistance of silver nanowire transparent conductive films stay nearly constant until the thickness of the oxidation protection layer reaches approximately 20 nm, whereupon it begins to increase rapidly.

Based on the data of FIGS. 6 and 7, when the thickness of the oxidation protection layer is 20 nm or less, the silver nanowire transparent conductive film maintains a predetermined light transmittance and shows low sheet resistance. For instance, the predetermined light transmittance may be 65% or more, 68% or more, or 70% or more throughout the wavelength range of 400 nm to 800 nm, and the sheet resistance may be 100.0 Ω/sq or less, 90.0 Ω/sq or less, or 85.0 Ω/sq or less. Thus, in one example, the thickness of the oxidation protection layer may be 20 nm or less.

In addition, when the silver nanowire transparent conductive film is used as an electrode, it is mainly used in an application, such as a solar cell, rather than in the field of displays. In this case, the conductivity of the silver nanowire transparent conductive film is a controlling design factor rather than its transparency. Thus, the most preferable thickness of the oxidation protection layer may be 20 nm, or approximately 18-23 nm, at which the sheet resistance of the silver nanowire transparent conductive film is maintained at a low level without diminishing performance. By adjusting the thickness, it is possible to prevent the performance of a flexible transparent electrode from diminishing over time, and to provide a flexible transparent conductive film having little or no change in performance over time.

Hereinafter, the present invention will be additionally described based on an actual Experimental Example.

EXAMPLE 1

First, a PET film was prepared, and silver (Ag) nanowires were applied onto the PET film. (thickness of Ag nanowires and method of applying the naowires to the PET film, the specific PET film used, etc. may be described here). Next, a $TiO_2$ oxide was coated on the surface of the silver nanowires using an ALD process.

TTIP (UP chemical) was used as a material for a $TiO_2$ oxidation protection layer, and the ALD process was performed using ALD system (ForALL) equipment at a pressure of $1 \times 10^{-3}$ torr and a temperature of 120° C. A desired number of 250-cycle (10 nm) and 500-cycle (20 nm) processes were performed according to the thickness of the $TiO_2$ oxidation protection layer.

In order to compare a transparent conductive film not coated with an oxidation protection layer with a transparent conductive film coated with an oxidation protection layer, XPS was used to check oxidation of the transparent conductive film over time. In order to analyze the form of the $TiO_2$ oxygen preventing layer and the silver nanowire film, measurement was performed using FE-SEM and HR-TEM.

Figure 8:
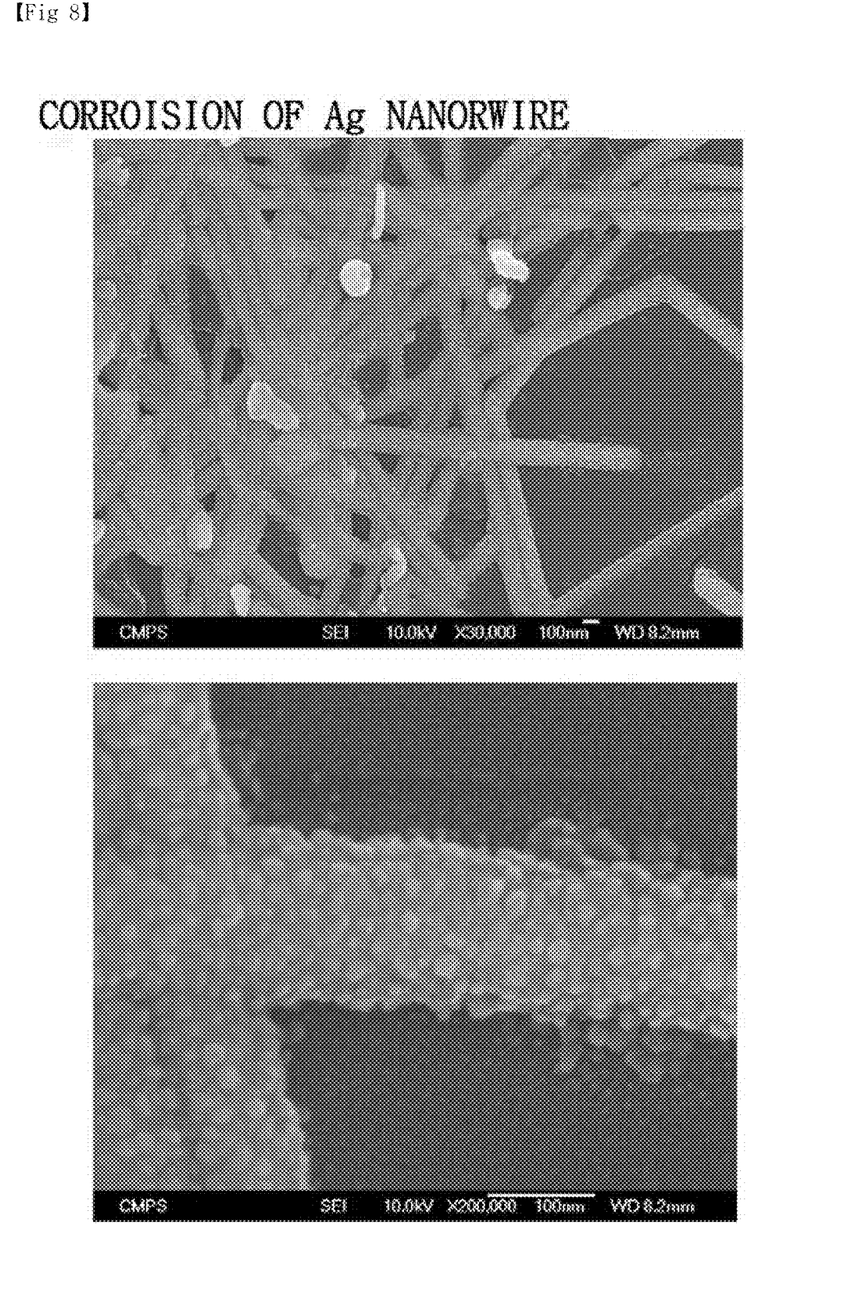
FIG. 8 illustrates photographic images of silver nanowires with an amorphous layer formed on the surface thereof with corrosion of a silver nanowire conductive film not coated with an oxidation protection layer.
Figure 9:
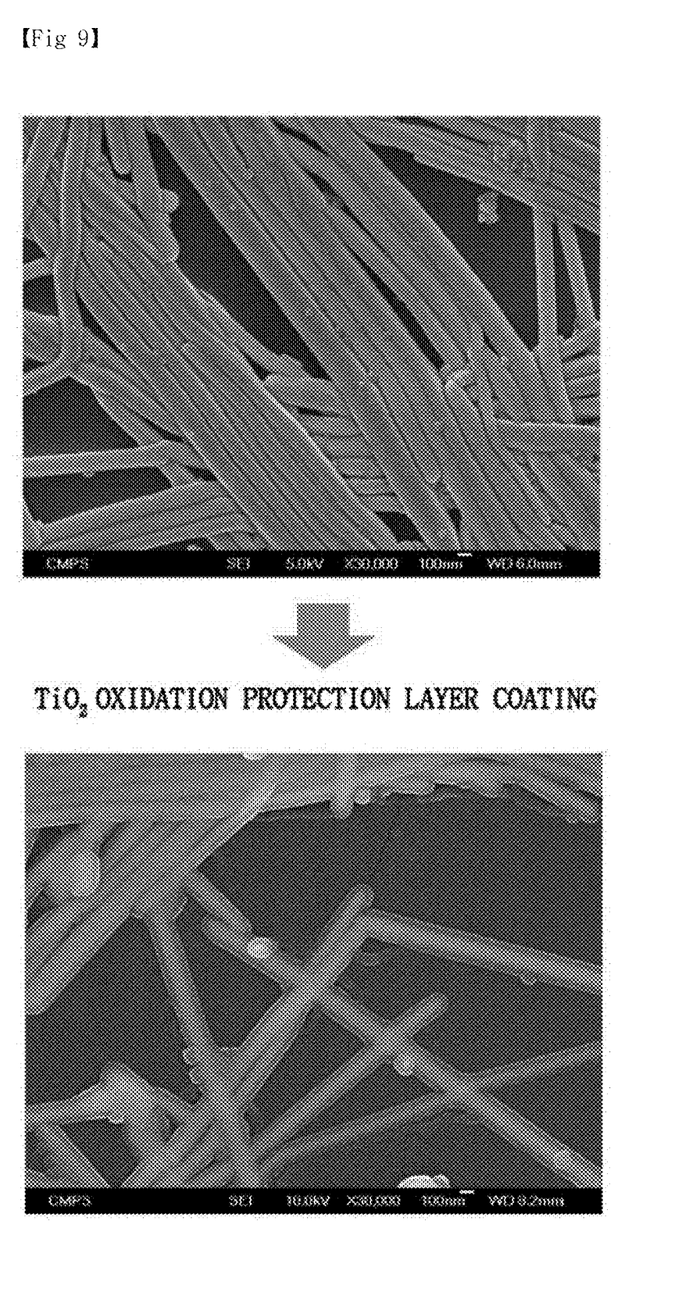
FIG. 9 illustrates photographic images of the surface of silver nanowires coated with a titanium oxide ($TiO_2$) oxidation protection layer.

FIG. 8 illustrates photographs of a conductive film in which an amorphous layer formed on the surface of silver nanowires and corrosion took place, the silver nanowires were of the film not being coated with an oxidation protection layer. FIG. 9 illustrates photographs illustrating the surface of silver nanowires coated with a $TiO_2$ oxidation protection layer.

In addition, the optical characteristics of the silver nanowire transparent conductive film over time and the oxidation protection layer coating were measured using UV-vis spectroscopy, and the electrical characteristics thereof were measured using 4-point probe equipment. These results are shown in FIGS. 6 and 7.

Figure 10:
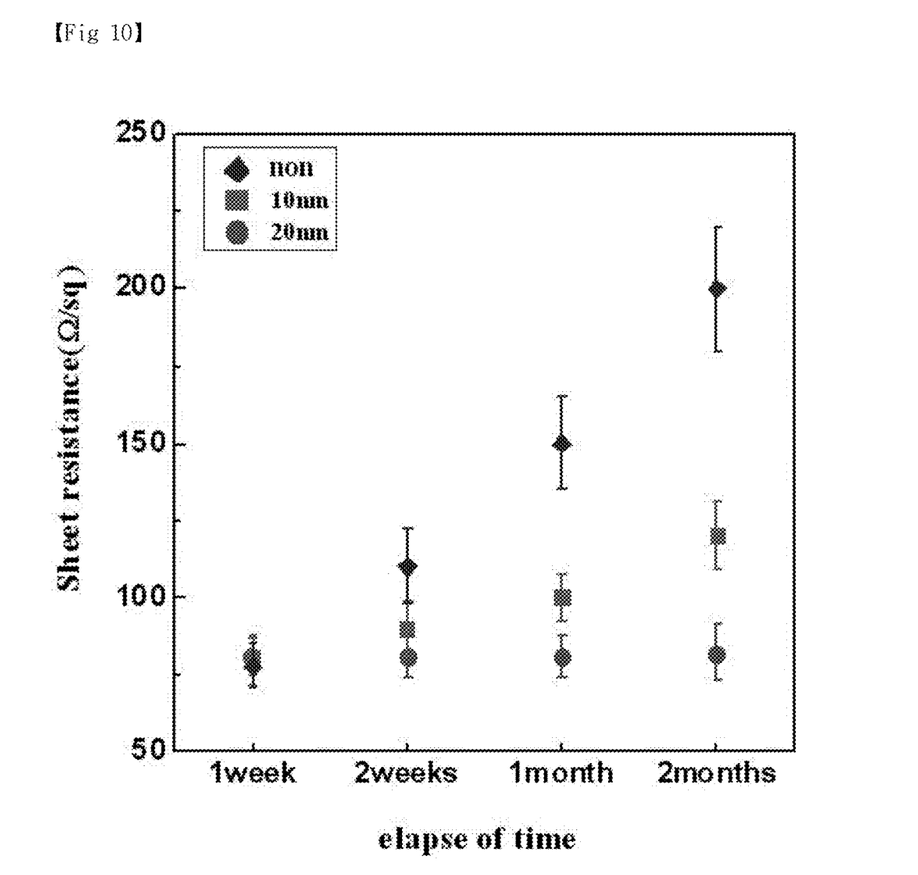
FIG. 10 is a graph illustrating changes in sheet resistance of various examples of silver nanowire conductive films over time.

According to the experimental results, the sheet resistance of a film that is not coated with an oxidation protection layer increases rapidly due to oxidation over time. On the other hand, the change in sheet resistance of a film coated with an oxidation protection layer is substantially smaller over time. Thus, it can be seen that applying an oxidation protection layer is very effective in preventing the oxidation of a silver nanowire conductive film. FIG. 10 illustrates changes in sheet resistance of silver nanowire conductive films having different oxidation protection layer thicknesses over time.

As illustrated in FIG. 10, the sheet resistance of a silver nanowire film having an oxidation protection layer with a thickness of 20 nm were maintained under 80.0 Ω/sq, and well under 100.0 Ω/sq after 2 months from the date of fabrication. On the other than, the sheet resistance of the silver nanowire film without the oxidation protection layer increased to greater than 150.0 Ω/sq during the 2 month period.

Described above are various methods of fabricating a flexible transparent conductive film. In some of the examples, a thin oxidation protection layer is coated on the surface of silver nanoparticles and a reduction in conductivity is prevented so that no significant change in performance occurs over time.

When the surface of a silver nanowire is exposed to the air, oxidation may occur on the silver nanowire due to oxygen in the air, which causes an increase in sheet resistance. The present disclosure is also directed to preventing the oxidation of silver nanowires by coating a thin oxygen preventing layer on the surface of the silver nanowires and protecting the silver nanowires from exposure to oxygen and preventing an increase in sheet resistance of the silver nanowires over time.

The flexible transparent conductive film coated with an oxidation protection layer on the surface of the silver nanoparticles is provided so that conductivity of the flexible transparent conductive film is maintained as time elapses and reliable and stable conductivity is guaranteed.

According to an example, there is provided a silver nanowire conductive film coated with an oxidation protection layer, including: a polymer film onto which a silver nanowire is applied; and an oxidation protection layer coated on a surface of the silver nanowire, wherein the oxidation protection layer is formed of an oxide that does not react with $H_2O$ and $CO_2$. The oxide may be formed from at least one selected from the group consisting of Ti, V, Ni, Cu, Zn, Zr, Nb, Y, Al, Si, Sn, and In, and the oxidation protection layer may be coated by an atomic layer deposition (ALD) process. A thickness of the oxidation protection layer may be 20 nm or less, or may be 20 nm.

According to another example, there is provided a method of fabricating a silver nanowire conductive film coated with an oxidation protection layer, the method including: applying silver nanowires onto a polymer film; and coating an oxidation protection layer on a surface of the silver nanowires, wherein the oxidation protection layer is formed of an oxide that does not react with $H_2O$ and $CO_2$. The oxide may be formed from at least one selected from the group consisting of Ti, V, Ni, Cu, Zn, Zr, Nb, Y, Al, Si, Sn, and In, and the applying an oxidation protection layer on a surface of the silver nanowires may be performed by an atomic layer deposition (ALD) process. A thickness of the oxidation protection layer may be 20 nm or less, or may be 20 nm.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A silver nanowire conductive film, comprising:
   a substrate;
   silver nanowires disposed on the substrate; and
   an oxidation protection layer coated on the silver nanowires,
   wherein the oxidation protection layer comprises an oxide,
   wherein a thickness of the oxidation protection layer is 18 nm to 23 nm,
   wherein the oxidation protection layer comprises tubular structures, each encapsulating a silver nanowire among the silver nanowires, and
   wherein the silver nanowire conductive film is a flexible transparent conductive film having a light transmittance of 70% or greater between 400-800 nm.

2. The silver nanowire conductive film of claim 1, wherein the substrate comprises a flexible polymer film, and the silver nanowires are disposed on the polymer film by spreading a silver nanowire resin in which the silver nanowires are dispersed with a doctor blade.

3. The silver nanowire conductive film of claim 1, wherein the oxide is a metal oxide or a metalloid oxide comprising at least one selected from the group consisting of Ti, V, Ni, Cu, Zr, Nb, Al, Si, Sn, and In.

4. The silver nanowire conductive film of claim 1, wherein the oxidation protection layer is coated by an atomic layer deposition (ALD) process.

5. The silver nanowire conductive film of claim 1, wherein the thickness of the oxidation protection layer is 18 nm to 20 nm.

6. The silver nanowire conductive film of claim 1, wherein sheet resistance of the silver nanowire conductive film remains under 100 Ω/sq after 60-day exposure to atmosphere under a standard temperature and pressure condition.

7. A display device comprising an electrode comprising the silver nanowire conductive film of claim 1.

8. The display device of claim 7, wherein the display device is an LCD screen.

9. The display device of claim 8, wherein the thickness of the oxidation protection layer is 20 nm.

10. The silver nanowire conductive film of claim 1, wherein the oxide is formed of Y.

* * * * *